United States Patent [19]

Stanbery

[11] Patent Number: 4,680,422
[45] Date of Patent: Jul. 14, 1987

[54] TWO-TERMINAL, THIN FILM, TANDEM SOLAR CELLS

[75] Inventor: Billy J. Stanbery, Seattle, Wash.
[73] Assignee: The Boeing Company, Seattle, Wash.
[21] Appl. No.: 792,942
[22] Filed: Oct. 30, 1985
[51] Int. Cl.[4] .................. H01L 27/14; H01L 31/06
[52] U.S. Cl. .................. 136/249; 136/265; 136/258; 29/572; 427/74; 427/76; 357/30
[58] Field of Search .......... 136/249 TJ, 265, 258; 357/30; 29/572; 427/74, 76

[56] References Cited

U.S. PATENT DOCUMENTS 4,536,607  8/1985  Wiesmann ............... 136/249

OTHER PUBLICATIONS

L. M. Fraas et al., *J. Appl. Phys.*, vol. 57, pp. 2302–2304 (1985).
J. C. C. Fan et al., *Solar Cells*, vol. 12, pp. 401–420 (1984).
J. C. C. Fan, *Solar Cells*, vol. 12, pp. 61–62 (1984).
R. W. Birkmire et al., *Conference Record, 17th IEEE Photovoltaic Specialists Conference* (1984), pp. 1406–1407.

*Primary Examiner*—Aaron Weisstuch
*Attorney, Agent, or Firm*—John C. Hammar

[57] ABSTRACT

Tandem solar cells combine the energy-absorbing efficiencies of 1.7 eV CdSe/ZnTe heterojunctions with 1.0 eV I-III-VI$_2$/II-VI heterojunctions in mechanically-stacked or monolithic cells. Lightweight, efficient tandem cells that are particularly suited to space applications due to their radiation hardness are constructed by judicious selection of the substrate, superstrate and semiconductor materials.

49 Claims, 2 Drawing Figures

TWO-TERMINAL, THIN FILM, TANDEM SOLAR CELLS

TECHNICAL FIELD

The present invention relates to mechanically-stacked or monolithic tandem solar cells, and to methods for making the cells. More particularly, the invention relates to a tandem cell having a II-VI semiconductor material overlying a graded ternary I-III-VI$_2$ semiconductor material, such as a CdSe/CuInSe$_2$ tandem.

BACKGROUND ART

Although research has attempted to develop a low-cost solar cell suitable for terrestrial and space applications, progress has been slow. Silicon cells are relatively inexpensive and have a moderately high efficiency, but they tend to have lower specific powers (watts/kg) because they use bulk materials which increase the overall weight. Although suitable for many terrestrial applications, these single crystal silicon cells have diminishing utility for space missions now that it is becoming ever more critical to conserve weight. Modern satellites seek a power supply that furnishes more power at a reduced weight to allow larger payloads that consume larger amounts of energy for space, the specific power of an array should be at least 300 watts/kg. Accordingly, research has shifted to focus on inexpensive, lightweight, high efficiency cells for these space applications. For instance, research has demonstrated a graded ternary I-III-VI$_2$ chalcopyrite semiconductor or photovoltaic transducer, as described in detail in U.S. Pat. No. Re. 31,968 and U.S. Pat. No. 4,523,051 (which are incorporated by reference into this description), that is lower cost, moderately efficient, and hardened against radiation. Efficiencies of about 10 to 11 percent AMO can now be achieved with these cells. Similarly, II-VI heterojunction solar cells, such as ZnTe-CdSe, have also been studied as shown, for example, by Gashin et al., *Radiative Recombination in ZnTe-CdSe and ZnSe-CdTe Heterojunctions*, Journal of Luminescence, vol. 15, 109–115 (1977), and Buch et al., *Photovoltaic Properties of n-CdSe/p-ZnTe Heterojunctions*, Applied Physics Letters, vol. 28, No. 10, 593–595 (May 16, 1976).

Neither the I-III-VI$_2$ nor the II-VI cells even as thin films independently achieves the goals of weight and power demanded for space and terrestrial solar cells. Solar cells of the present invention, however, combine these I-III-VI$_2$ and II-VI cells into a mechanically-stacked or monolithic thin film tandem to achieve a higher efficiency photovoltaic transducer that is particularly suited for space applications. The cell has surprisingly high resistance to radiation damage, is low cost due, in part, to polycrystalline structure, and is relatively lightweight due to thin film technology.

SUMMARY OF THE INVENTION

The present invention relates to a polycrystalline, tandem, photovoltaic transducer or solar cell comprising an upper cell of a II-VI heterojunction and a lower cell of a graded ternary I-III-VI$_2$ semiconductor. Preferably, the upper cell is an n-type CdSe/p-type ZnTe heterojunction having a band gap of about 1.7 eV, while the lower cell is a CuInSe$_2$ cell having a band gap of about 1.0 eV.

The upper cell generally includes an n$^+$-type transparent conductive oxide layer contacting the CdSe and containing SnO$_2$ or ZnO. This conductive oxide layer, in turn, is bonded to a substantially transparent superstrate having an optical transparency in the range of between about 400 to 1300 nm in the mechanically-stacked configuration of the tandem solar cell, where it is preferable that the lower cell includes a CuInSe$_2$/(Cd, Zn)S heterojunction as described in detail in U.S. Pat. No. Re. 31,968 and U.S. Pat. No. 4,523,051 to Mickelsen and Chen. Graded ternary cells of this type for the lower half of the tandem are bonded to a molybdenum contact which is deposited by RF or DC magnetron sputtering on a suitable substrate. As suggested by Harry Dursch of The Boeing Company, higher specific power of the cell for space applications can be achieved by bonding the CuInSe$_2$ semiconductor to a 2–5 mil titanium metal foil substrate, which exhibits the best match in the coefficient of thermal expansion between the substrate and semiconductor material while being at least 50 percent lighter than other candidates for the substrate. Thermal cycling is more readily withstood.

By using thin films for both layers, the active region of the semiconductor material comprises a relatively large proportion of the entire film, and the percentage of inactive or waste material is reduced.

In the monolithic configuration, a graded I-III-VI$_2$ chalcopyrite semiconductor material is deposited on a suitable substrate, a graded interface connector is then deposited on the chalcopyrite semiconductor to provide a smooth lattice match transition between the chalcopyrite and the upper II-VI semiconductor cell. The interface connector preferably comprises n-ZeSe/p-ZnTe. An n-type CdSe/n$^+$-SnO$_2$:F or n-CdSe/n$^+$-ZnO frontwall drift field cell is sequentially deposited atop the interface connector to complete the upper cell.

Antireflection coatings and adhesives may be used, as necessary, in the mechanically-stacked and monolithic cells.

These and other features of the invention will be understood from the following detailed description.

BEST MODE CONTEMPLATED FOR MAKING OR USING THE INVENTION

The present invention relates to mechanically-stacked or monolithic tandem solar cells or photovoltaic transducers, and to methods for making each type of cell.

To simplify the description of these several features of the present invention, this description will be divided into sections, and reference will be made to the drawings to aid understanding.

1. Mechanically-Stacked Tandem Cell

Figure 1:
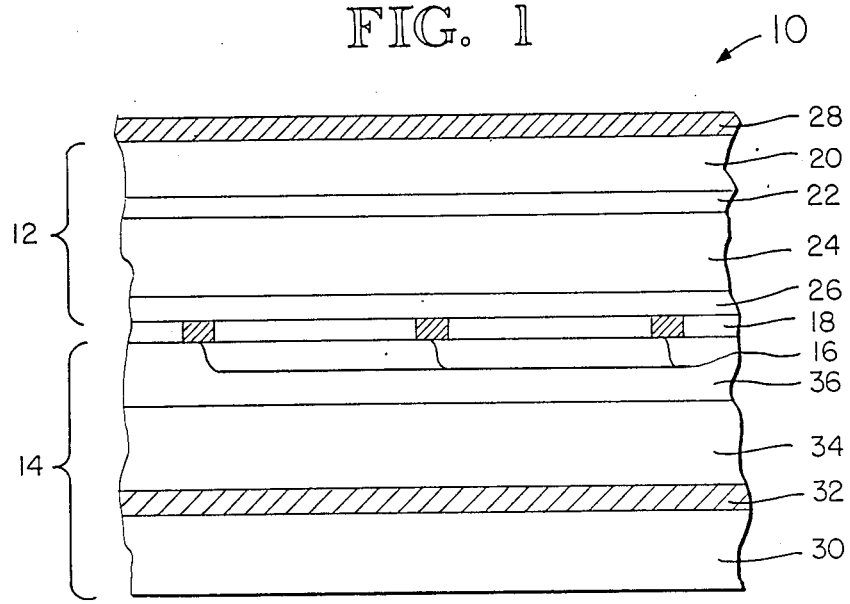
FIG. 1 is a schematic cross-sectional view of a mechanically-stacked tandem solar cell of the present invention.

As shown schematically in FIG. 1, a mechanically-stacked solar cell or photovoltaic transducer 10 of the present invention includes an upper cell 12 and a lower cell 14 connected by a metalization grid 16 and a suitable transparent adhesive 18 (if necessary). The metalization grid 16 is preferably formed by copper deposited on the upper cell 12 and a matching grid of chrome or nickel, and indium on the lower cell. When pressed together at an elevated temperature, this metalization is probably adequate to hold the cells mechanically and to interconnect them electrically. An adhesive 18 may be wicked around the metalization, however, to provide more secure mechanical bonding of the cells. The adhesive 18 should be transparent in the range between about 700–1300 nm (and preferably about 400–1300 nm), should adhere to the surfaces of both the top and bottom cells, should be easily processable, and should accommodate the differential coefficient of thermal expansion between the upper and lower cells. While epoxy adhesives are preferred (if adhesive is used at all), the adhesive 18 can be selected from the group consisting of silicones, ethylvinyl acetates, polyvinyldifluorides, polyimides, or mixtures thereof (if deposited in layers on one cell prior to pressing the cells together). Metalization without adhesive is preferred as the mechanical interconnect, particularly for space applications, since the adhesives can reduce efficiency by absorbing incident light and can lead to cell failure by degrading more rapidly than the semiconductors under radiation.

a. The upper cell

The upper cell 12 comprises several discrete semiconductive layers adhered to and deposited on a suitable transparent superstrate 20, generally of alumina or borosilicate glass or sapphire. The semiconductor layers make the cell 12 into a frontwall drift field cell having a II-VI heterojunction. Preferably about 2-10 micrometers of $SnO_2$:F or ZnO:Al is deposited on a sapphire superstrate 20 by CVD or spraying at a temperature of about 350°–450° C. as is conventional to form an n+-type transparent conductive oxide layer 22. Atop this layer 22, a 3-5 micrometer layer 24 of n-CdSe is deposited by simultaneous elemental reactive evaporation on a binary system otherwise analogous to the methods of Mickelsen and Chen described in U.S. Pat. No. Re. 31,968 and U.S. Pat. No. 4,523,051 (both incorporated by reference), as will be described in greater detail. The heterojunction is completed thereafter by depositing a layer 26 of p-ZnTe by an enhanced deposition process, such as by reactive evaporation or OMCVD at low temperatures below about 350° C. The ZnTe layer 26 is doped with phosphorus or copper, and is sufficiently thick to be uniform, usually about 0.5–3.0 micrometers.

If desired, one or more layers 28 of antireflection coatings, such as $SiO_x$, may be adhered to the upper surface of the superstrate 20 to retain incident light and to boost the overall efficiency of the cell.

Although $SnO_2$:F or ZnO:Al on sapphire is preferred for its radiation hardness, the superstrate 20 may be glass. $SnO_2$:F on glass can be purchased from Chronar or Nippon glass. A $SnO_2$:halide layer might also be suitable, but those skilled in the art will recognize the benefits of $SnO_2$:F, which forms the contact for the upper cell 12.

b. The Lower Cell

The lower cell 14 preferably is a polycrystalline, thin film, I-III-$IV_2$ chalcopyrite semiconducor, and, more preferably, a p-$CuInSe_2$/n-(Cd,Zn)S heterojunction made according to the method of Mickelsen and Chen in U.S. Pat. No. Re. 31,968 and U.S. Pat. No. 4,523,051. Briefly, the Mickelsen and Chen method forms a graded, ternary semiconductor free of voids and copper nodules by simultaneous elemental reactive evaporation. The rates of evaporation of the several elements, the substrate temperature, and the reactor pressure are controlled to achieve high efficiency, polycrystalline thin films having efficiencies up to about 10% AMO.

As shown in FIG. 1, the lower cell 14 comprises a substrate 30 of polycrystalline alumina, glazed alumina, enameled steel, metal foil, or a similar inert inorganic material. As suggested by Harry Dursch of The Boeing Company the best substrate 30 for space applications has proven to be a 2–5 mil titanium metal foil. This foil can withstand the high temperatures necessary for fabricating the cell (450° C. for 20 min) without cracking, melting, softening, or distorting. When cooled, the foil retains its desirable mechanical properties. Titanium foil has a coefficient of thermal expansion that essentially matches that of the semiconductor material of the cell ($3.0$–$5.0 \times 10^{-6}$ in./in./°F.). This match prevents excessive residual stresses or flaking within the cell during thermal cycling between about $-175°$ C. to $100°$ C., as is experienced in space applications. No outgassing occurs from the substrate during deposition. The titanium foil is substantially smooth and free of defects or irregularities. Finally, the foil provides the possibility of high specific powers (watts/kg) since titanium, especially at two mils, is as light a substrate as heretofore believed possible. Titanium has a density about 50% Less than other suitable substrates, such as molybdenum foil, and is, accordingly, much lighter. Specific power ratios above 300 watts/kg for arrays are achievable and possibly as high as 1000 watts/kg for cells with the judicious selection of the active semiconductor thin films in the tandem solar cell.

A base contact 32 of molybdenum is deposited over the substrate 30 by RF or DC magnetron sputtering. Then, a graded ternary layer of $CuInSe_2$ is deposited on the contact by reactive evaporation. Improved semiconductors are formed by controlling the mean free path between vapor particles in the reactor by increasing the pressure to produce a homogenous mixture, as described in U.S. Pat. No. 4,523,051. The evaporation rates for Cu and Se should be closely controlled throughout the deposition and particularly in the initial deposition of $CuInSe_2$ onto the Mo contact 32, in the bulk of the thin film, and in the region near the junction of the film. The substrate temperature should also be closely controlled throughout the deposition.

The $CuInSe_2$ layer 34 has two different composition graded regions sequentially formed with one region having a first preselected ratio of two elements in the ternary semiconductor material so as to form a low resistivity semiconductor region and the other region having a different preselected ratio of the elements so as to form a high resistivity transient semiconductor region. The two regions define a transient homojunction. Essentially, one region near the junction is deficient in copper while the other region is copper-rich to form a p-n type heterojunction, as described in detail in U.S. Pat. No. 31,968.

While $CuInSe_2$ is preferred for the lower cell 14, other materials on the I-III-$VI_2$ chalcopyrite semiconductor family might be used, such as a thin-film A-B-type heterojunction where "A" and "B" are selected from the group of semiconductor materials consisting of:

| A | and B |
|---|---|
| (i) a p-type ternary material | and an n-type material; |

| A | and B |
|---|---|
| (ii) an n-type ternary material | and a p-type material; |
| (iii) an n-type material | and a p-type ternary material; |
| (iv) a p-type material | and an n-type ternary material. |

Compounds of this family include $AgInS_2$, $AgGaSe_2$, $AgGaTe_2$, $AgInSe_2$, $CuGaTe_2$, $AgInTe_2$, or $CuGaS_2$, but these materials may only have limited application in solar cells because of their band gaps.

The lower cell 14 is completed by depositing a (Cd,Zn)S window layer 36 on the $CuInSe_2$ to form a heterojunction, as explained in the Mickelsen and Chen patents. The resulting cell 14 is a low-cost, polycrystalline transducer having a conversion efficiency of at least about 8% AMO, and, preferably over 10% AMO efficiency when tested apart from the tandem. Efficiencies of 10.4% AMO have been achieved.

The upper cell 12 preferably has a band gap of about 1.4–1.6 eV, while the bottom cell 14 has a band gap of about 1.0 eV. To this end, the upper cell may be amorphous silicon, GaAs, CLEFT GaAs, GaAlAs, CLEFT GaAlAs, or the II-VI heterojunction, particularly n-CdSe/p-ZnTe, described in detail above. The lowest cost with a surprisingly high resistance to radiation damage and with moderately high efficiencies (leading to a specific power in excess of 300 watts/kg) are achievable with the preferred $CdSe/ZnTe-CuInSe_2$ tandem on titanium foil.

To electrically isolate the contact from the titanium foil substrate in preferred cells, it is desirable to coat the foil with a dielectric, such as a layer of $Si_3N_4$. Radiation resistant cover layers can be added to either the upper or lower cells to improve their radiation resistance and to ease handling of the cells during fabrication of arrays. Two mils of FEP-Teflon is adequate for these purposes.

2. The Monolithic Cell

Figure 2:
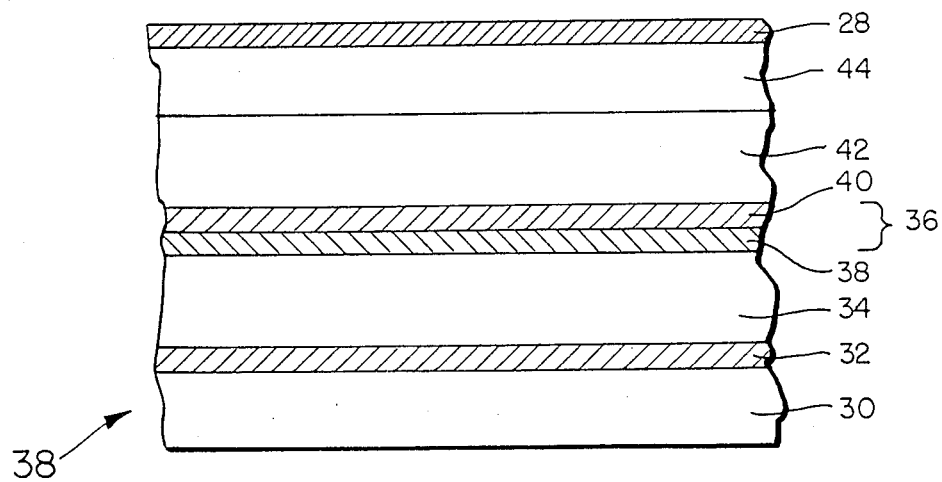
FIG. 2 is another schematic cross sectional view of a monolithic, tandem solar cell, similar to FIG. 1, of the present invention.

As shown in FIG. 2, the present invention also relates to a monolithic tandem cell 38 using active semiconductor materials similar to the mechanically-stacked cell 10. Here, however, the layers are sequentially deposited upon a single substrate into two photoactive layers separated by a lattice mismatch interface connector.

a. The lower photoactive layer

The substrate 30 is identical to that of the lower cell 14 of the mechanically-stacked tandem 10, and, preferably, is a 2–5 mil sheet of titanium foil, so that the resulting transducer has the lightest weight and can withstand the severe environment of repetitive thermal cycling in space. Very high specific powers as already described, can be achieved with titanium foil as compared with conventional substrates.

As with the mechanically-stacked cell 10, a thin layer 32 of molybdenum (about 6000 A° thick) is deposited on the substrate 30 to form a base contact. A graded ternary I-III-$VI_2$ semiconductor layer 34 (about 3.0–3.5 micrometers thick) then is deposited by simultaneous reactive elemental evporation on the Mo, according to the method of Mickelsen and Chen, as previously described. This layer 34 preferably is a $CuInSe_2$ thin film being deficient in copper near the junction so as to be a p-n type material in the transition from the contact to the junction. A $Si_3N_4$ dielectric isolates the contact 32 from the substrate 30, if the substrate is a conductive metal foil, such as titanium.

b. The lattice mismatch transition

The monolithic cell 38 requires an interface connector 36 so that the lattice mismatch between the $CuInSe_2$ and the upper photoactive layer of the tandem is accommodated. This interface connector 36 has two regions 38 and 40 to make the transition in two steps. The first transition region 38 is preferably an n-type ZnSe thin film window layer deposited by low temperature, plasma enhanched CVD at temperatures no greater than about 350° C. to avoid detrimental elemental interdiffusion at the junction. This region is about 0.5–2.0 micrometers thick (preferably about 1.0 micrometers), and is degenerately doped with aluminum in the region away from the photoactive junction with $CuInSe_2$.

Although plasma enhanced deposition is preferred to reduce the deposition temperatures required to grow the films, it is possible to use other enhancement techniques, such as OMCVD or laser technologies, to deposit these films.

Atop the n-ZnSe, a second region 40 of p-ZnTe is deposited by plasma enhanced CVD at low temperatures. This region 40 is about 0.5–3.0 microns thick, and is degenerately doped with phosphorus or copper in the region away from the upper photoactive junction.

The $CuInSe_2$ to ZnSe lattice mismatch is only about 2.0% and the mismatch between ZnSe/ZnTe is only about 0.4%. Therefore, a graded interface layer 36 of ZnSe/ZnTe is suitable to interconnect the $CuInSe_2$ active layer 34 to the upper layer 42 of CdSe. If other I-III-$VI_2$ chalcopyrites or II-VI heterojunctions are used in the tandem 38, the interface layer 36 should be selected to achieve this type of smoothly stepped transition. Furthermore, the interface connector should be transparent to energy passing through the upper photoactive layer.

The ZnSe/ZnTe layer minimizes the propagation of lattice defects from the lower to the upper junction.

Low temperature deposition minimizes dopant redistribution within each region, thereby avoiding undesirable reactions at the film interfaces.

c. The upper photoactive layer

The monolithic cell 38 is completed by depositing n-CdSe, a II-VI semiconductor, in a thin film layer 42 of about 3–5 micrometers thickness onto the ZnTe region 40 by reactive evaporation, and then by depositing a transparent conductive oxide layer 44 of $n^+$-type $SnO_2$:F or ZnO:Al by CVD or sputtering on the CdSe. One or more layers of an antireflection coating 28, such as $SiO_x$ or $MgF_2$, can be applied above the $n^+$ type layer 42 to improve cell efficiencies.

The resulting tandem 38 is low-cost, moderately efficient, polycrystalline, and surprisingly space hardened against radiation damage. Since no adhesive or metalization is required to interconnect the two photoactive layers, the cell is less susceptible to radiation than the mechanically-stacked tandem 10. Also, the monolithic cell 38 should be able to withstand thermal cycling better than the mechanically-stacked tandem.

As described, a $CuInSe_2$/CdSe monolithic cell is preferred, although other I-III-$VI_2$/II-VI cells are possible.

The interface connector might be a graded [(Cd,Zn)(S,Se)] quarternary material, if desired, and this type of material might also be used to form the junction on the CuInSe$_2$ in the mechanically-stacked tandem, although CdS of Cd$_x$Zn$_{1-x}$S is preferred, since these materials are binaries or ternaries. The quarternary material [(Cd,Zn)(S,Se)] provides greater flexibility in the lattice matching.

While preferred embodiments have been shown and described, those skilled in the art will readily recognize alterations, variations, or modifications that might be made to the particular embodiments that have been described without departing from the inventive concept. This description, the examples, and the drawings are intended to illustrate the invention, and not to limit it, unless such limitation is necessary in view of the pertinent prior art. Accordingly, the claims should be interpreted liberally in view of this description to protect the preferred embodiments of the invention that have been described and all reasonable equivalents. The claims should only be limited as is necessary in view of the pertinent prior art.

I claim:

1. A polycrystalline, tandem, photovoltaic transducer, comprising:
   (a) an upper cell having a bandgap of about 1.7 eV and comprising a heterojunction of n-type CdSe and p-type ZnTe, the junction being formed by depositing the ZnTe on the CdSe at low temperatures below about 350° C.;
   (b) a lower cell electrically connected to the upper cell, having a bandgap of about 1.0 eV, and comprising a thin film heterojunction between a graded ternary I-III-VI$_2$ semiconductor and a thin film II-VI semiconductor window layer.

2. The transducer of claim 1 wherein the upper cell includes an n+-type transparent conductive oxide layer contacting the CdSe.

3. The transducer of claim 2 wherein the oxide layer forms a contact for the upper cell.

4. The transducer of claim 3 wherein the oxide layer includes SnO$_2$ or ZnO.

5. The transducer of claim 4 wherein the oxide layer includes SnO$_2$:F.

6. The transducer of claim 2 wherein the upper cell includes a substantially optically transparent superstrate, transparent in the range between about 400–1300 nm, bonded to the oxide layer.

7. The transducer of 6 wherein the lower cell semiconductors include a CuInSe$_2$/(Cd,Zn)S heterojunction.

8. The transducer of claim 7 wherein the lower cell includes a contact and a substrate bonded to the contact.

9. The transducer of claim 8 wherein the contact includes molybdenum.

10. The transducer of claim 9 wherein the substrate of the lower cell is a metal foil.

11. The transducer of claim 10 wherein the foil is titanium.

12. The transducer of claim 7 wherein the connection between the upper and lower cells is metalization between the ZnTe layer and the (Cd,Zn)S layer.

13. The transducer of claim 1 wherein the lower cell semiconductors include a CuInSe$_2$/(Cd, Zn)S heterojunction.

14. The transducer of claim 13 wherein the lower cell is made according to one of the methods of Mickelsen and Chen described in U.S. Pat. No. 31,968.

15. The transducer of claim 13 wherein the lower cell is made according to one of the methods of Mickelsen and Chen described in U.S. Pat. No. 4,523,051.

16. The transducer of claim 13 wherein the lower cell includes a contact bonded to the CuInSe$_2$ and a substrate bonded to the contact.

17. The transducer of claim 16 wherein the contact includes molybdenum.

18. The transducer of claim 17 wherein the substrate of the lower cell is a metal foil.

19. The transducer of claim 1 wherein the lower cell includes a contact bonded to the I-III-VI$_2$ semiconductor layer and a substrate bonded to the contact.

20. The transducer of claim 19 wherein the substrate of the lower cell is a metal foil.

21. The transducer of claim 1 wherein the connection between upper and lower cells is metalization between the ZnTe layer and the II-VI semiconductor layer.

22. The transducer of claim 1 further comprising an adhesive between the upper and lower cells.

23. The transducer of claim 22 wherein the adhesive is selected from the group consisting of silicones, ethylvinyl acetates, epoxies, polyvinyldifluorides, and polyimides.

24. The transducer of claim 22 wherein the adhesive is an epoxy.

25. The transducer of claim 22 wherein the adhesive is substantially optically transparent in the range of about 700–1300 nm.

26. A polycrystalline, thin-film, tandem photovoltaic transducer, comprising:
   (a) an upper cell having a bandgap of about 1.7 eV and comprising:
      (i) a substantially optically transparent superstrate in the range of about 400–1300 nm;
      (ii) an n+ conductive oxide layer deposited on the superstrate, the layer including either SnO$_2$ or ZnO and having a thickness of between about 2–10 micrometers; and
      (iii) a frontwall heterojunction comprising about a 3–5 micrometer layer of CdSe deposited on the oxide layer and about a 0.5–3 micrometer layer of ZnTe deposited on the CdSe at a temperature at or below about 350° C. to control and limit CdSe-ZnTe interdiffusion at the heterojunction;
   (b) a lower cell having a bandgap of about 1.0 eV and comprising:
      (i) a substrate;
      (ii) a molybdenum contact layer deposited on the substrate; and
      (iii) a graded CuInSe$_2$/(Cd,Zn)S semiconductor heterojunction deposited on the contact layer; and
   (c) metalization connecting the upper and lower cells between the ZnTe layer of the upper cell and (Cd,Zn)S layer of the lower cell.

27. The transducer of claim 26 further comprising a substantially optically transparent adhesive in the range between about 700–1300 nm for bonding the upper and lower cells.

28. The transducer of claim 26 wherein the oxide layer includes SnO$_2$:F.

29. The transducer of claim 26 wherein the lower cell is made according to one of the methods of Mickelsen and Chen described in U.S. Pat. No. Re. 31,968.

30. The transducer of claim 26 wherein the substrate is titanium foil.

31. The transducer of claim 30 wherein the superstrate is either glass or sapphire.

32. A polycrystalline, thin-film, tandem, photovoltaic transducer, especially adapted for terrestrial and space solar cell applications, comprising:
  (a) a polycrystalline p-ZnTe/n-CdSe/n+ conductive oxide frontwall heterojunction drift field cell as the upper cell of the tandem; and
  (b) a thin-film, I-III-VI$_2$/II-VI heterojunction as the lower cell of the tandem, the lower cell being characterized as without voids or copper nodules and having an energy conversion efficiency, when tested apart from the tandem, of a least about 8% AMO.

33. The transducer of claim 32, exhibiting superior radiation hardness characteristics, low weight, and high energy conversion efficiency, further comprising:
  (a) a substantially optically transparent sapphire superstrate for the upper cell;
  (b) a titanium metal foil substrate for the lower cell;
  (c) a molybdenum contact deposited over the foil beneath the heterojunction; and
  (d) a dielectric between the foil and contact.

34. The transducer of claim 33 wherein the lower cell heterojunction is graded CuInSe$_2$/(Cd,Zn)S.

35. The transducer of claim 34 wherein the upper cell has a bandgap of about 1.7 eV and the lower cell has a bandgap of about 1.0 eV.

36. A monolithic, polycrystalline, tandem, photovoltaic transducer, comprising:
  (a) a lower cell comprising a I-III-VI$_2$ semiconductor photoactive layer having a bandgap of about 1.0 eV;
  (b) a graded interface connector deposited on the lower cell to provide a smooth lattice match transition between the lower cell and an upper cell of the tandem, the connector being degenerately doped in the regions away from the photoactive junctions; and
  (c) a polycrystalline n-type CdSe/n+, transparent conductive oxide cell deposited sequentially atop the connector to form the upper cell, the upper cell having a bandgap of about 1.7 eV.

37. The transducer of claim 36 wherein the lower cell photoactive layer includes CuInSe$_2$.

38. The transducer of claim 36 wherein the interface connector includes n-ZnSe/p-ZnTe.

39. The transducer of claim 36 wherein the lower cell includes a molybdenum contact deposited on a substrate below the photoactive layer.

40. The transducer of claim 39 wherein the substrate is a metal foil, and the cell further comprises a dielectric between the foil and contact.

41. The transducer of claim 40 wherein the foil is titanium.

42. The transducer of claim 36 further comprising an antireflection coating bonded to the transparent conductive oxide.

43. A monolithic, polycrystalline, tandem, photovoltaic transducer, comprising:
  (a) a metal foil substrate;
  (b) a molybdenum contact deposited over the substrate;
  (c) a p-CuInSe$_2$ layer having a bandgap of about 1.0 eV deposited on the contact;
  (d) a graded n-ZnSe/p-ZnTe interface connector deposited upon the p-CuInSe$_2$ layer, the interface layer being degenerately doped in the regions away from the photoactive junctions;
  (e) an n-CdSe layer having a bangap of about 1.7 eV deposited on the p-ZnTe of the interface layer; and
  (f) a transparent conductive oxide upper contact deposited on the n-CdSe layer.

44. The transducer of claim 43 further comprising an antireflection coating bonded to the upper contact.

45. A method of making a monolithic, polycrystalline, tandem, photovoltaic transducer, comprising the steps of:
  (a) applying a metallic base contact to a suitable substrate;
  (b) sequentially depositing a graded p-CuInSe$_2$ layer on the contact, the layer having two regions, a first region on the contact and a second region away from the contact atop the first region, the regions being formed by the simultaneous elemental evaporation of Cu, In, and Se, the region away from the contact being slightly copper deficient so as to form a moderately high resistivity, transient n-type layer;
  (c) depositing n-ZnSe on the n-type CuInSe$_2$ layer by low temperature CVD to avoid interdiffusion at the junction;
  (d) depositing p-ZnTe on the n-ZnSe by low temperature CVD to avoid interdiffusion at the junction, the n-ZnSe and p-ZnTe forming an interface transition between the lattice of the CuInSe$_2$ layer and an upper cell, and being degenerately doped in the regions away from the photoactive junctions;
  (e) depositing n-CdSe to form the upper cell on the p-ZnTe; and
  (f) depositing an upper contact of n+-type transparent conductive oxide on the n-CdSe.

46. The method of claim 45 further comprising the step of applying an antireflection coating to the upper contact.

47. The method of claim 45 wherein the p-CuInSe$_2$ layer has a bandgap of about 1.0 eV and the n-CdSe has a bandgap of about 1.7 eV.

48. A method for making a polycrystalline, tandem, photovoltaic transducer, comprising the steps of:
  (a) forming a lower cell by the steps of:
    (i) depositing a molybdenum contact over a metal foil substrate;
    (ii) depositing a graded p-n type CuInSe$_2$ layer on the contact by simultaneous elemental evaporation, the layer having a portion removed from the contact that is copper-deficient, and having a bandgap of about 1.0 eV;
    (iii) depositing an n-(Cd,Zn)S layer atop the CuInSe$_2$ layer;
  (b) forming an upper cell by the steps of:
    (i) depositing an n+-type transparent conductive oxide layer on a glass or sapphire superstrate;
    (ii) depositing a layer of n-CdSe by reactive evaporation on the n+-type layer; and
    (iii) depositing a layer of p-ZnTe at low temperatures on the n-CdSe to avoid interdiffusion at the junction;
  (c) applying metalization to either the ZnTe or (Cd/Zn)S; and
  (d) pressing the upper and lower cells together under suitable heat to bond the upper and lower cells together through the metalization.

49. The method of claim 48 further comprising the step of applying a substantially optically transparent adhesive to the upper and lower cells around the metalization.

* * * * *